United States Patent [19]
Hung et al.

[11] Patent Number: 5,835,414
[45] Date of Patent: Nov. 10, 1998

[54] PAGE MODE PROGRAM, PROGRAM VERIFY, READ AND ERASE VERIFY FOR FLOATING GATE MEMORY DEVICE WITH LOW CURRENT PAGE BUFFER

[75] Inventors: Chun-Hsiung Hung, Hsinchu, Taiwan; Ray-Lin Wan, Fremont, Calif.; Yu-Sui Lee, Kaoshiung, Taiwan

[73] Assignee: Macronix International Co., Ltd., Hsinchu, Taiwan

[21] Appl. No.: 718,334

[22] PCT Filed: Jun. 14, 1996

[86] PCT No.: PCT/US96/10393

§ 371 Date: Oct. 1, 1996

§ 102(e) Date: Oct. 1, 1996

[87] PCT Pub. No.: WO97/48101

PCT Pub. Date: Dec. 18, 1997

[51] Int. Cl.$^6$ ................................................. G11C 16/06
[52] U.S. Cl. ........................ 365/185.25; 365/185.12; 365/185.29
[58] Field of Search ................ 365/185.25, 185.12, 365/185.29, 185.2

[56] References Cited

U.S. PATENT DOCUMENTS

| | | | |
|---|---|---|---|
| 4,054,864 | 10/1977 | Audaire et al. | 340/173 R |
| 4,811,294 | 3/1989 | Kobayashi et al. | 365/185.22 |
| 4,890,259 | 12/1989 | Simko | 365/45 |
| 5,163,021 | 11/1992 | Mehrotra et al. | 365/185.03 |
| 5,218,569 | 6/1993 | Banks | 365/189.01 |
| 5,245,570 | 9/1993 | Fazio et al. | 365/185 |

(List continued on next page.)

FOREIGN PATENT DOCUMENTS

| | | | |
|---|---|---|---|
| WO 95/00077 | 5/1995 | WIPO | A61B 19/00 |
| WO 95/34074 | 12/1995 | WIPO | G11C 11/56 |
| WO 95/34075 | 12/1995 | WIPO | G11C 13/00 |

OTHER PUBLICATIONS

Kobayashi, S., et al., "A 3.3 V Only 16 Mb Dinor Flash Memory", ULSI Laboratory, Mitsubishi Electric Corp., Japan, Nov. 1997, 13 pages.

Jung, T. et al., "A 3.3V 128 Mb Multi–Level NAND Flash Memory for Mass Storage Applications", 1996 IEEE International Solid–State Circuits Conference, Digest of Technical Papers, Feb. 1996, pp. 32–33.

Bauer, M. et al., "A Multilevel–Cell 32Mb Flash Memory", 1995 IEEE International Solid–State Circuits Conference, Digest of Technical Papers, Feb. 1995, pp. 132–133.

Mills, et al., "A 3.3V 50MHz Sychronous 16Mb Flash Memory", IEEE International Solid–State Circuits Conference, pp. 120–131, Feb. 1995.

(List continued on next page.)

*Primary Examiner*—David C. Nelms
*Assistant Examiner*—Hoai V. Ho
*Attorney, Agent, or Firm*—Wilson Sonsini Goodrich & Rosati

[57] ABSTRACT

A page mode flash memory or floating gate memory device, includes a page buffer based on low current bit latches. The low current bit latches enable efficient program, program verify, read and erase verify processes during page mode operation. The array includes bit lines coupled with corresponding columns of cells in the array, and wordlines coupled with corresponding rows of cells in the array. Bit latches are coupled to respective bit lines to provide a page buffer. Control logic executes the steps of (1) setting a set of bit lines to a pre-charge voltage level (such as VDD or ground); (2) isolating the pre-charged bit line, applying a wordline voltage to the wordline of the page of cells to be sensed; and (3) responding to changes in the voltage levels of the bit lines (which are discharged if a memory cell is conductive) in response to the wordline voltage, to store a constant in the bit latches coupled to the bit lines on which the voltage levels of the bit lines passes a determinate threshold during the step of applying a wordline voltage. The bit lines are connected to the gate terminal of a pass transistor, so that when the turn on threshold of the pass transistor is passed on the bit line, the pass transistor if turned on, and the constant is loaded into the bit latch.

33 Claims, 7 Drawing Sheets

U.S. PATENT DOCUMENTS

| | | | |
|---|---|---|---|
| 5,283,758 | 2/1994 | Nakayama et al. | 365/185 |
| 5,294,819 | 3/1994 | Simko | 257/314 |
| 5,297,081 | 3/1994 | Challa | 365/184 |
| 5,323,351 | 6/1994 | Challa | 365/218 |
| 5,357,463 | 10/1994 | Kinney | 365/185.22 |
| 5,363,330 | 11/1994 | Kobayashi et al. | 365/185 |
| 5,369,609 | 11/1994 | Wang et al. | 365/185 |
| 5,379,256 | 1/1995 | Tanaka et al. | 365/185 |
| 5,414,658 | 5/1995 | Challa | 365/185.06 |
| 5,418,743 | 5/1995 | Tomioka et al. | 365/189.01 |
| 5,422,845 | 6/1995 | Ong | 365/185 |
| 5,450,363 | 9/1995 | Christopherson et al. | 365/205 |
| 5,615,149 | 3/1997 | Kobayashi et al. | 365/185.12 |
| 5,625,590 | 4/1997 | Choi et al. | 365/185.17 |
| 5,638,326 | 6/1997 | Hollmer et al. | 365/185.2 |
| 5,646,886 | 7/1997 | Brahmbhatt | 365/185.16 |

OTHER PUBLICATIONS

Suh, et al., "A 3.3V 32Mb Nand Flash Memory With Incremental Step Pulse Programming Scheme", IEEE International Solid–State Circuits Conference, pp. 128–129, Feb. 195.

Tanaka, et al., "High–Speed Programming and Program–Verify Methods Suitable For Low–Voltage Flash Memories", IEEE Symposium on VLSI Circuits Digest of Technical Papers, pp. 61–62(1994).

PAGE MODE PROGRAM, PROGRAM VERIFY, READ AND ERASE VERIFY FOR FLOATING GATE MEMORY DEVICE WITH LOW CURRENT PAGE BUFFER

BACKGROUND OF THE INVENTION

1. Field of the Invention

The present invention relates to integrated circuit memory devices based on floating gate transistor technology; and more particularly to high speed program, program verify, read and erase verify algorithms for page mode flash memory.

2. Description of Related Art

Flash memory is a growing class of non-volatile storage integrated circuit based on floating gate transistors. The memory cells in a flash device are formed using so called floating gate transistors in which the data is stored in a cell by charging or discharging the floating gate. The floating gate is a conductive material, typically polysilicon, which is insulated from the channel of the transistor by a thin layer of oxide, or other insulating material, and insulated from the control gate of the transistor by a second layer of insulating material.

To store data in a floating gate memory cell, the floating gate is charged or discharged using a Fowler-Nordheim tunneling mechanism, or a hot electron injection mechanism. The Fowler-Nordheim tunneling mechanism is executed by establishing a large positive (or negative) voltage between the gate and source or drain of the device. This causes electrons to be injected into (or out of) the floating gate through the thin insulator. The hot electron injection mechanism is based on an avalanche process. Hot electron injection is induced by applying potentials to induce high energy electrons in the channel of the cell, which are injected across the thin insulator into the floating gate. To induce hot electron injection, a potential is applied across the source and drain of the device, along with a positive potential on the control gate. The positive potential on the control gate tends to draw electrons from the current in the channel of the device into the floating gate.

The acts of charging and discharging the floating gate in a floating gate memory device are relatively slow compared to writing other memory types, like static or dynamic random access memory, and limit the speed with which data may be written into the device.

Another problem associated with floating gate memory devices arises because the charging and discharging of the floating gate is difficult to control over a large array of cells. Thus, some of the cells program or erase more quickly than others in the same device. In a given program or erase operation, not all the cells subject of the operation will settle with the same amount of charge stored in the floating gate. Thus, so called program verify and erase verify sequences have been developed to efficiently ensure that the memory is being accurately programmed and erased. The program and erase verify operations are based on comparing the data stored in the floating gate memory array with the intended data. The process of comparing data is relatively time consuming, involving sequencing byte by byte through the programmed or erased cells. If a failure is detected in the verify sequence, then the program or erase operation is retried. Program retries are typically executed word-by-word or byte-by-byte in prior art devices. Thus, bits successfully programmed in a byte with one failed bit are subject to the program cycle repeatedly. This can result in over-programming and failure of the cell.

One approach to resolving this issue is set forth in U.S. Pat. No. 5,163,021 by Mehrotra, et al., at column 19, line 10 at sec. FIGS. 14–17.

To improve the efficiency of program and program verify operations, so called page mode flash devices have been developed. In these devices, a page buffer is associated with the memory array. The page buffer includes a set of bit latches, one bit latch associated with each global bit line in the array. To program a page in the array, the page buffer is loaded with the data to be programmed, by transferring byte by byte the program data into the bit latches of the page buffer. The program operation is then executed in parallel on a bit line by bit line basis controlled by the contents of the bit latches. The verify procedure is based on clearing automatically all of the bit latches in the page buffer which are successfully programmed in a parallel operation. The page buffer is then read byte-by-byte to confirm that all bits have been cleared, indicating a successful program operation.

The page mode program process is described for example in commonly owned prior PCT patent application entitled ADVANCED PROGRAM VERIFY FOR PAGE MODE FLASH MEMORY, filed 5 Jan. 1995, application Ser. No. PCT/US95/00077 In this application, the program verify operation relies on the sense amplifiers in the memory, which are limited in number, typically to 16, to sense the state of the memory cells being programmed. If the cell is programmed to the proper state, then the bit latch is reset based on the sense amplifier output. The sense amplifier is used because of charge sharing issues which arise from attempting to sense the level of bit lines in the memory array by a latch structure. The bit latch structure typically requires a significant current to reliably reset the latch. The sense amplifier circuit is able to provide sufficient current to reset the bit latch, while the bit line current through the memory cells is normally low due to the small geometry of the cells.

Other attempts at page mode program verify circuits have been made. For example, Tanaka, et al., "High-Speed Programming And Program-Verify Methods Suitable For Low-Voltage Flash Memories", Symposium on VLSI Circuits, Digest of Technical Papers, 1994, pgs. 64–62. The Tanaka, et al., paper describes a system in which the bit latches are directly coupled to the bit lines of the array. However, in the design proposed by Tanaka, et al., the bit latches directly fight the bit line voltage. Thus the bit line is required to conduct sufficient current to flip the bit latch. The design is therefore difficult to implement efficiently, and the data integrity is questionable because the bit line and latch fight for charge during the verify sequence.

Another prior art approach is described in Suh, et al., "A 3.3V 32 Mb NAND Flash Memory With Incremental Step Pulse Programming Scheme", 1995 IEEE International Solid-State Circuits Conference, pg. 128–129 (Feb. 16, 1995). In Suh, et al., a page buffer structure is described in which a current mirror structure is utilized to boost the driving capability of the bit lines for resetting bit latches. In Suh, et al., during the verify operation, the wordlines are pumped to an increased voltage to double the cell current. A current mirror is coupled with each bit line to fight with the cell. After waiting enough time for the bit line to discharge, a parallel reset of the latches is based on resulting the bit line voltage. The reliance on a current mirror in association with each bit latch requires extra current drive capability during the verify process, and increases the complexity of the circuit.

Neither Suh, et al., nor Tanaka, et al., describe bit latches be for use with processes which involve applying a high voltage to the bit lines, as required for some types of floating gate memory program or erase operations.

An improved page buffer which operates with low current bit lines, and is capable of supporting program, program verify, read and erase verify processes in a page mode is desirable. Furthermore, it is desirable that the page buffer be useful for applying high voltage pulses to bit lines based on the contents of the page buffer. With these improvements, a high speed page mode flash memory can be provided.

SUMMARY OF THE INVENTION

The present invention provides a page mode flash memory or floating gate memory device, which includes a page buffer based on low current bit latches. The low current bit latches enable efficient program, program verify, read and erase verify processes during page mode operation.

The page mode program, program verify, read and erase verify operations are dependent on the ability to reset bit latches based on the state of memory cells being sensed in a verify sequence or a read sequence. Thus, the invention can be characterized as a method for determining a state of a set of memory cells in an array of floating gate memory cells. The array includes bit lines coupled with corresponding columns of cells in the array, and wordlines coupled with corresponding rows of cells in the array. Bit latches are coupled to respective bit lines to provide a page buffer. The method includes the steps of (1) setting a set of bit lines to a pre-charge voltage level (such as VDD or ground); (2) isolating the pre-charged bit line, applying a wordline voltage to the wordline of the page of cells to be sensed; and (3) responding to changes in the voltage levels of the bit lines (which are discharged if a memory cell is conductive) in response to the wordline voltage, to store a constant in the bit latches coupled to the bit lines on which the voltage levels of the bit lines passes a determinate threshold during the step of applying a wordline voltage.

The step of responding to changes of voltage levels on the bit lines is based on providing a pass transistor, coupled between a supply of the constant voltage, and an input to a bit latch in the page buffer. The bit lines are connected to the gate terminal of the pass transistor, so that when the turn on threshold of the pass transistor is passed on the bit line, the pass transistor is turned on, and the constant is loaded into the bit latch. By connecting the gate of the pass transistor to the bit line, no current is required for causing the bit latch to change state. Thus, the bit lines for cells which are in a conductive state during the verify process, discharge without fighting the current required to switch the bit latch.

In one preferred embodiment, bit line coupling noise on the device is limited during the verify sequence by enabling every other bit latch in one cycle, and then the remaining bit latches in a next cycle. Also, power consumption is limited by lowering the supply voltage in the bit latches, for example from VDD (about 5 volts) to about 2 volts during the verify sequence.

In one embodiment, the pass transistor is composed of a p-channel transistor having a source coupled to the VDD supply terminal, and a drain coupled, optionally through an enabling transistor, to the input of the bit latch. When the voltage on the bit line falls below the turn on threshold of the p-channel transistor, then the VDD supply voltage is passed through the pass gate to the input of the bit latch, setting the state of the bit latch to the desired constant. An alternative system can be based on n-channel transistors, which supply the ground potential to the input of the bit latch based on changes in voltage level of the bit lines. Thus, using this structure, the bit latch responds to changes in voltage levels on the bit lines, substantially without drawing current from the bit lines.

The verify sequence is useful in a program operation. According to the program operation, the process involves first storing data for a set of memory cells to be programmed in the set of bit latches. A programming potential is applied to the bit lines in the set of bit lines in response to one binary value (1 or 0, "program" value) of data in the bit latches, but not the other binary value (0 or 1, a "do not program" value). According to the implementation of the bit latch described below, this programming potential can be a high voltage as suits the needs of a particular design.

After the programming potential is applied, the verify sequence is executed. The verify sequence results in resetting those bit latches which pass to a constant value if a successful program is achieved where the constant corresponds to the "do not program" value. The program verify operation is then based on sensing whether all bits in the page buffer are set to the constant "do not program" value.

The process of sensing whether the page buffer stores all "do not program values" can be executed with a simple automatic control signal, as described below, or can be accomplished using the byte-by-byte sensing based on the sense amplifier circuitry.

The bit latch is used to control the application of high programming potentials in a preferred embodiment. This technique is accomplished by providing a pass transistor, having its gate terminal connected to an output of the bit latch, and its drain connected to the source of the high programming potential. The source of the pass transistor is coupled to the bit line, through an enable transistor. This allows a high voltage source, independent of the bit latch, to be used for controlling the voltage level of the bit line. In addition, this same pass transistor can be used for the pre-charging path, by connecting a multi-level voltage source to the drain of the pass transistor. This allows the application of the pre-charge voltage, and the programming voltage to the bit line. Also, by applying a constant voltage level during the process of transferring data from the bit latch to the data input/output lines, this same bit latch output can be used to transfer the contents of the data directly to chip output lines, or alternatively to an on chip cache memory.

In a preferred flash memory device, according to the present invention, the cell polarity is set such that cells are erased by charging up the floating gates of the cells to establish a high turn on threshold for the cells, and are programmed by discharging the floating gates to establish a low turn on threshold. The page buffer is used to store 1K (1024) bits of information, coupled to a corresponding 1K bit lines, and then to program those bits in parallel. Thus the page buffer is constructed using 1K bit latches which map to 1K bit lines. When the bit latch data is set to 1, the corresponding cell receives a high programming voltage during the program operation. If the cell is successfully programmed, that is the threshold voltage is shifted low enough, the latch content is reset to 0 during the verify operation. This way, the cell will not program again on a next program retry. If all of the bit latches are reset to 0, then the program operation is finished. If some latches remain at the data value 1, then the program operation is retried.

The low current bit latches are also used in a page mode read operation. Thus, the page mode read operation is based on first pre-setting all the bit latches to the "program" value, a complement of the constant value which is stored in response to the verily operation. The verify sequence is applied with a read potential on the word lines of the page. After the verify operation, all of the bit latches which are connected to bit lines on which a cell was accessed having a conductive state on application of the read voltage, are reset to the constant. The other latches in the page buffer remain set at the complement of the constant. Page read access is provided to the bit latch for reading the data off the chip. Because the bit latch can supply large current and has little capacitance, the read process is thus significantly speeded up for a page of data. The first byte of such a read operation takes the amount of time that is required to load the page buffer with data. All subsequent bytes however, are read at the access speed of the bit latch, which can be significantly faster than the access speed of prior art large scale floating gate memory arrays. With a page buffer which is greater than 500 bits, and preferably greater than 1000 bits wide, a significant average speed increase is achieved.

This structure is also used in a page mode erase verify operation. In this operation, the bit latches are first pre-stored to the "program" value. After erase, the wordline voltages are set for an erase verity process. When the erase operation results in a high threshold in the floating gate cells, none of the bit latches should be reset by the verify operation. If any are reset, then the erase process can be retried.

The present invention can also be characterized as an integrated circuit memory. In the memory, a plurality of bit line control elements, are coupled with corresponding bit lines in the array. The bit line control element includes a memory element, such as a standard SRAM type latch with opposing inverters. A first means is connected to one input of the memory element and the corresponding bit line and has a load control input. This first means is used for selectively connecting a current path between the corresponding bit line and the memory element in response to a signal on the load control input. This first means, implemented using a pass transistor or equivalent technology, is used to load a control bit in the memory element from the corresponding bit line, such as during the process of loading data to be programmed into the memory element, from the external circuitry, such as from the SRAM cache or other buffer on the device.

The bit line control element includes second means which is connected to the memory element and to a constant supply, such as the VDD terminal. This second means has an enable input, and an input connected to the corresponding bit line, for selectively connecting the constant supply to the memory element in response to a determinate voltage level on the corresponding bit line, when enabled by a signal on the enable input. This provides for supplying the constant value to the input of the bit latch, by a current path isolated from the bit line during the verify operation.

A third means is included in the bit line control element, based on a pass gate as well, having an enable input and an input connected to an output of the memory element. This pass gate is used for selectively connecting a bit line voltage source to the corresponding bit line in response to one state of the control bit stored in the memory element, by current path isolated from the memory element, when enabled by a signal on the enable input. The bit line voltage source is preferably a multi-level voltage source, providing the ability to provide a high programming potential to the bit line, a pre-charge potential to the bit line, and a ground potential to the bit line.

Providing a page buffer based on the plurality of the bit line control elements, according to the present invention, enables a wide variety of page mode operations in the device. To control page mode operations, a control state machine is provided coupled with the plurality of bit line control elements which supplies the control signals to the enable inputs of the first, second and third means to establish a control bit load state, a program state, a verify state, and a read state for the plurality of bit line control elements. The control state machine operates in the load state to control the column decoder on the device to load sets of bit line control elements with control bits supplied across the data input/output bus on the device. In the program state, the state machine sets the bit line voltage source to a program potential, and supplies a signal to the enable input of the third means, to transfer of the program potential to the corresponding bit line. In the verify state, the state machine pre-charges the plurality of bit lines, by enabling the third means, and applying a pre-charge potential to the bit line through the third means. Then, verify potential is applied to a selected wordline and a signal is coupled to the enable input of the second means, which causes the constant to be stored in the memory element if the bit line passes the turn on threshold of the second means. In the read state, the state machine sets the bit line voltage source to a read potential, and supplies a signal to the enable input of the third means, so that the read potential is applied to the bit line if the control elements stores a particular value. The column decoder in the device is then controlled to connect sets of bit lines to the data input/output bus to supply sets of data from the memory elements in the bit line control elements to the data input/output bus in a read mode.

During the parallel program verify process, three key issues are the present invention, including 1) excess current and power during the verity operation, 2) bit line coupling noise, and 3) the bit line discharge time for the verify process. Using the design of the present invention, the high current and excess power problem during the verify operation is solved by lowering the power supply to the bit latch. This reduces the current consumed by the bit latch during the verify operation, and overall reduces the current consumption of the device. The bit line coupling noise problem can be solved using the bit latch structure of the present invention by applying the verify pulse separately to odd and even bit lines.

The bit line discharge time depends on the capacitance of the bit line, and the magnitude of the cell discharge current. The bit latch structure of the present invention allows low current, low capacitance structures, to be utilized within a given bit line discharge time specification.

Also, the read operation is improved according to the present invention. Conventionally, the read operation is a random access process within the floating gate memory array, and relatively slow requiring with typical current technology about 100 nanoseconds per byte. Using the page buffer read concept described above, it takes on the order of a microsecond for reading the first byte, and for example about 50 nanoseconds for each of the following bytes, which can be 127 bytes for a 1K bit (128 byte) the page buffer. The speed of the following bytes is determined by the speed of reading bit latch data.

Accordingly, on improved page mode flash memory design has been provided based on low current bit latch structures, and versatile inter-connections of the bit latches with the bit lines. Efficient page mode devices greatly increase the speed of operation in a variety of circumstances.

Other aspects and advantages of the present invention can be seen upon review of the figures, the detailed description, and the claims which follow.

DETAILED DESCRIPTION

Figure 3:
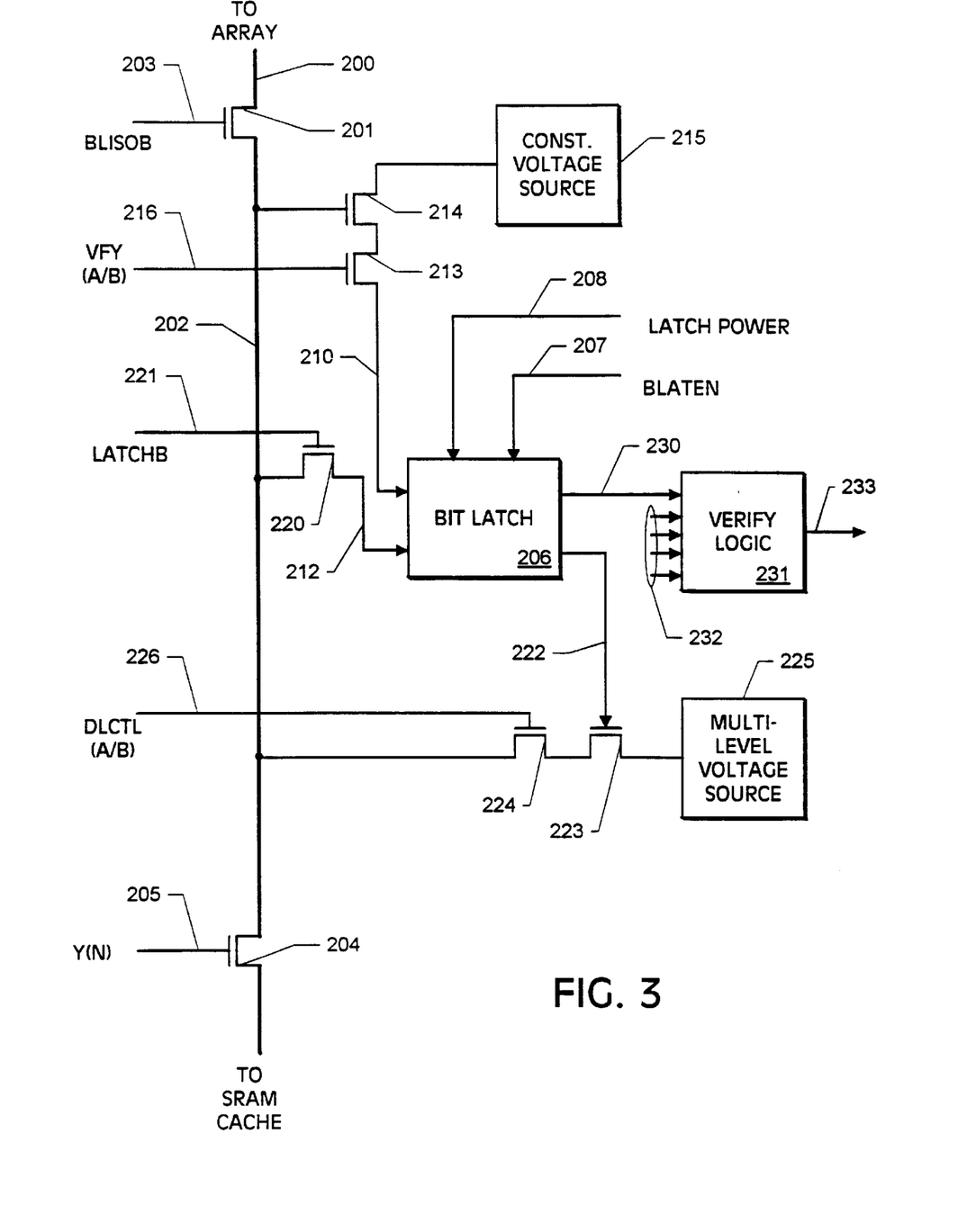
FIG. 3 is a simplified diagram of the bit latch structure according to the present invention.
Figure 4:
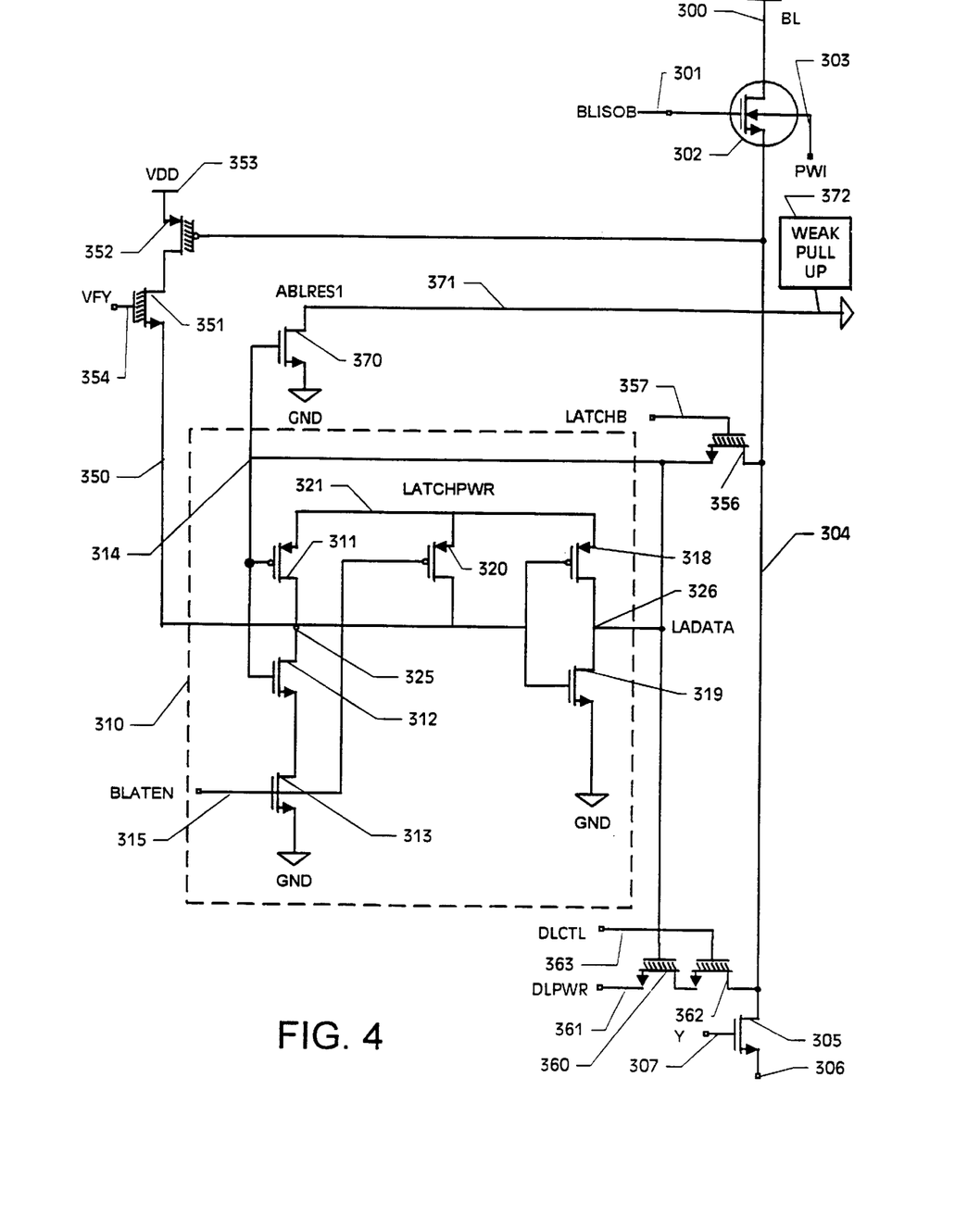
FIG. 4 is a circuit diagram of a preferred embodiment of the bit latch structure according to the present invention.
Figure 5:
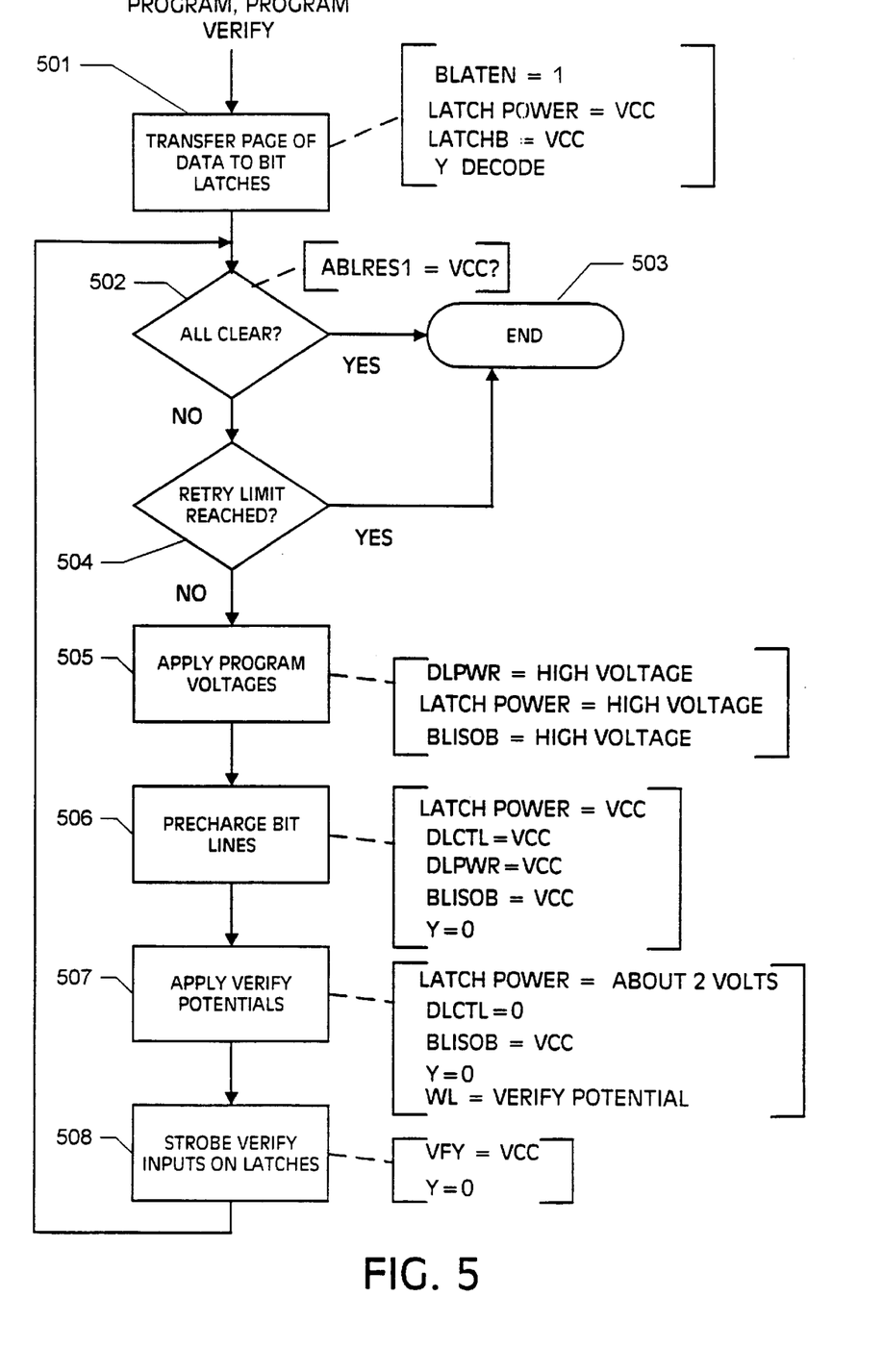
FIG. 5 is a flow chart illustrating the program and program verify operation executed using the bit latches of the present invention.
Figure 6:
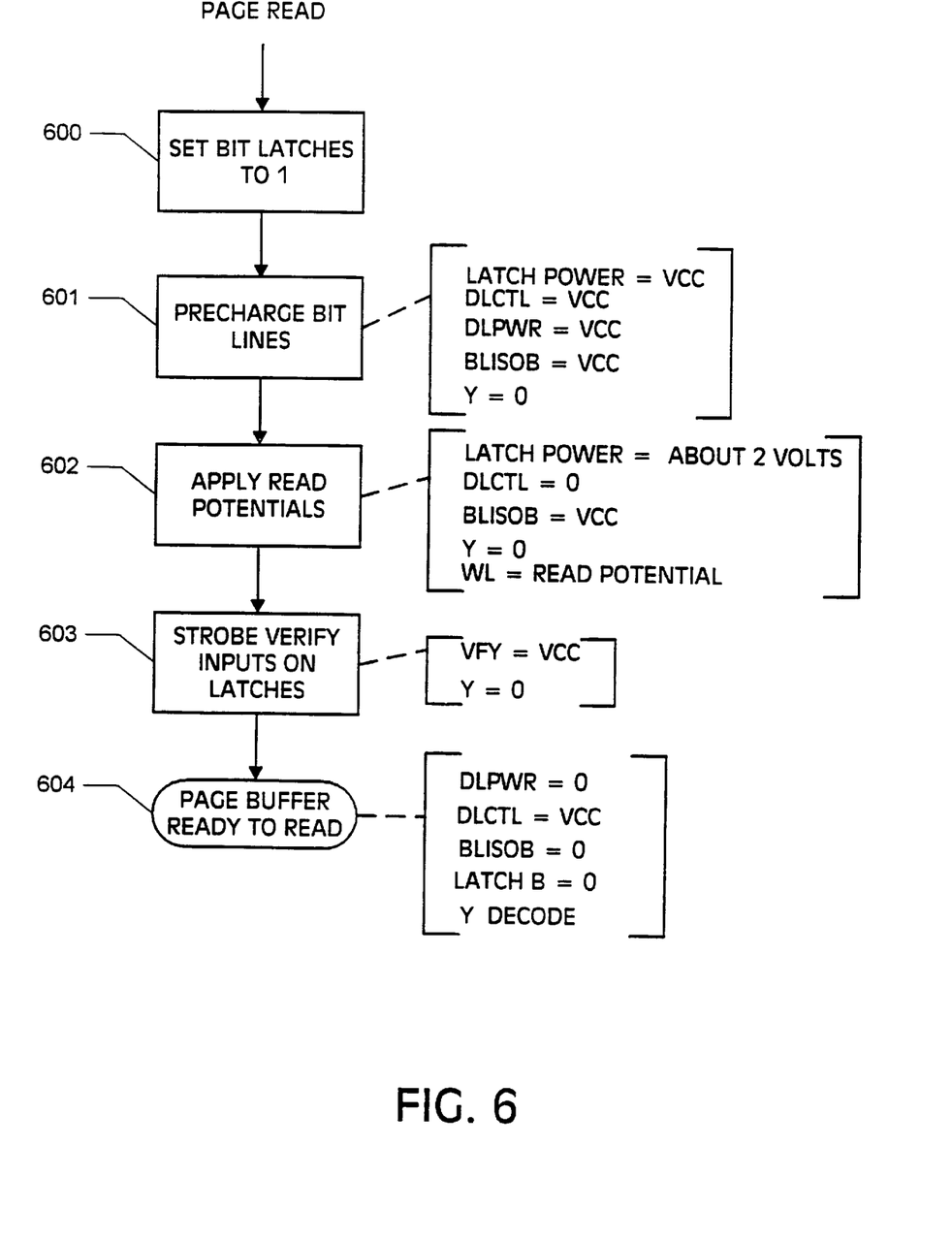
FIG. 6 is a flow chart illustrating the page read process according to the present invention.
Figure 7:
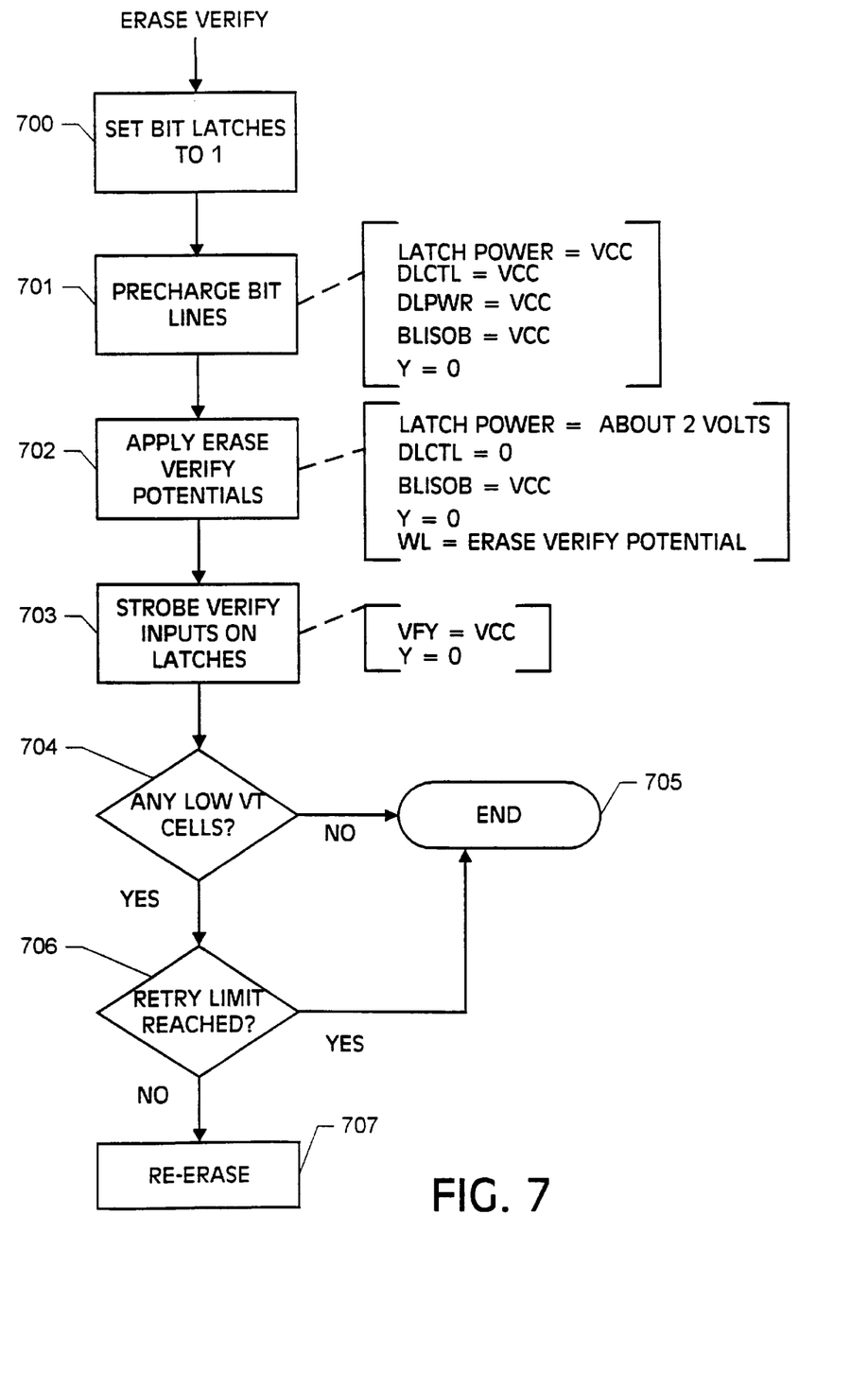
FIG. 7 is a flow chart illustrating a page mode erase verify process according to the present invention.

A detailed description of preferred embodiments of the present invention is provided with reference with FIGS. 1–7, in which FIGS. 1–4 illustrate the structure utilized according to the present invention, and FIGS. 5–7 illustrate processes executed which take advantage of the low current bit latches provided by the present invention.

Figure 1:
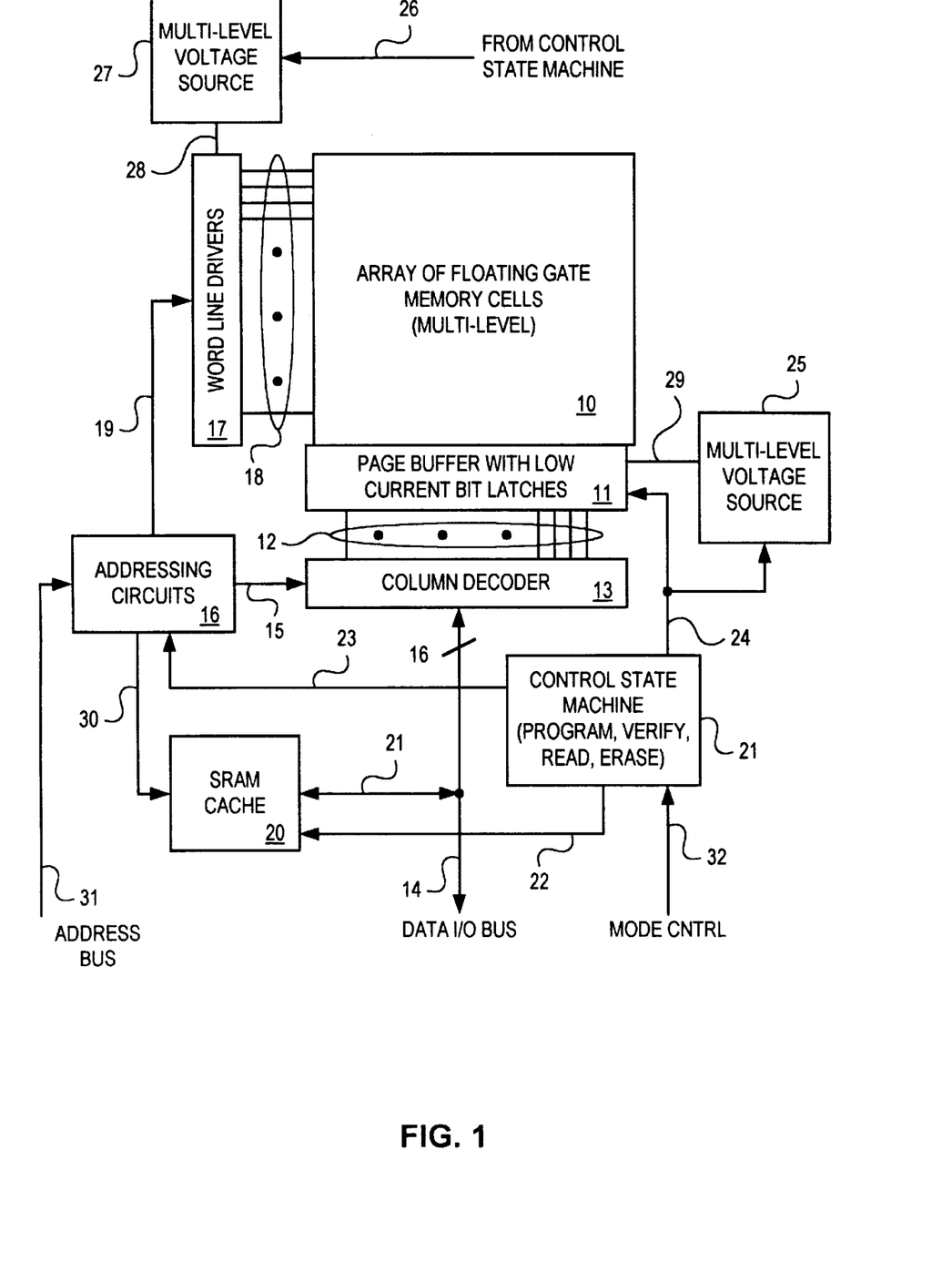
FIG. 1 is a basic block diagram of a floating gate memory integrated circuit according to the present invention.

FIG. 1 is a block diagram of an integrated circuit memory including an array 10 of floating gate memory cells. A page buffer 11 with low current bit latches according to the present invention is coupled to the array 10 of floating gate memory cells. The low current bit latches in the page buffer 11 are coupled to respective bit lines in the set 12 of bit lines which pass through the array 10 of floating gate memory cells. The set 12 of bit lines is coupled to a column decoder 13 for selecting subsets of the set of bit lines onto a data input/output bus 14. In one example, the data input/output bus 14 is 16 bits wide (2 bytes) and the set 12 of bit lines is 1K (1024) bits (128 bytes) wide. Thus, the column decoder 13 will select 16 bit lines in the set 12 of bit lines onto the data input/output bus 14 at a time in response to addressing signals supplied across line 15 from addressing circuits 16 on the device. Also coupled to the array 10 of floating gate memory cells is a set of wordline drivers 17 which drive a set 18 of wordlines in the array 10 of floating gate memory cells. The wordline drivers select particular rows of cells response to addressing signals supplied on line 19 from the addressing circuits 16 of the device. Optionally, an SRAM cache 20 is included on the integrated circuit memory. The SRAM cache 20 is connected across line 21 to the data input/output bus 14, and acts as a cache (also called a buffer) for storing and reading data for the array 10 of floating gate memory cells. Thus, data is transferred into the cache 20, and from the cache 20 into the array 10 of floating gate memory cells, and vice versa in order to provide a flexible input/output interface for the integrated circuit memory.

The integrated circuit memory also includes a control state machine 21 which supplies control signals on line 22 to the SRAM cache 20, control signals on line 23 to the addressing circuits 16, control signals on line 24 to the page buffer 11 and to a multi-level voltage source 25 connected to the page buffers across line 29. Also, control signals are supplied from the control state machine on line 26 to a multi-level voltage source 27 which is coupled to the wordline drivers 17 across line 28.

The SRAM cache 20 is responsive to addressing signals on line 30 from the addressing circuits 16, and control signals on line 22 from the control state machine 21 to act cooperatively with the input/output operations for the array 10 of floating gate memory cells.

Addresses are supplied to the integrated circuit memory on address bus 31. The address bus 31 is coupled to the addressing circuits 16. The addressing circuits generate addressing signals for the wordline drivers 17, the column decoder 13, and the SRAM cache 20.

Also, mode control inputs are supplied on line 32 to the control state machine 21. The mode control inputs on line 32 may be supplied from an external source to the integrated circuit memory, or may be generated by decoding address and data lines, as is known in the art.

According to the present invention, the control state machine 21 executes processes for page mode program, page mode program verify, page mode read, and page mode erase verify operations, in a manner which takes advantage of the low current bit latches in the page buffer 11. These processes can be understood better after a description of a preferred floating gate memory array and page buffer architecture as provided below with reference FIGS. 2–4.

Figure 2:
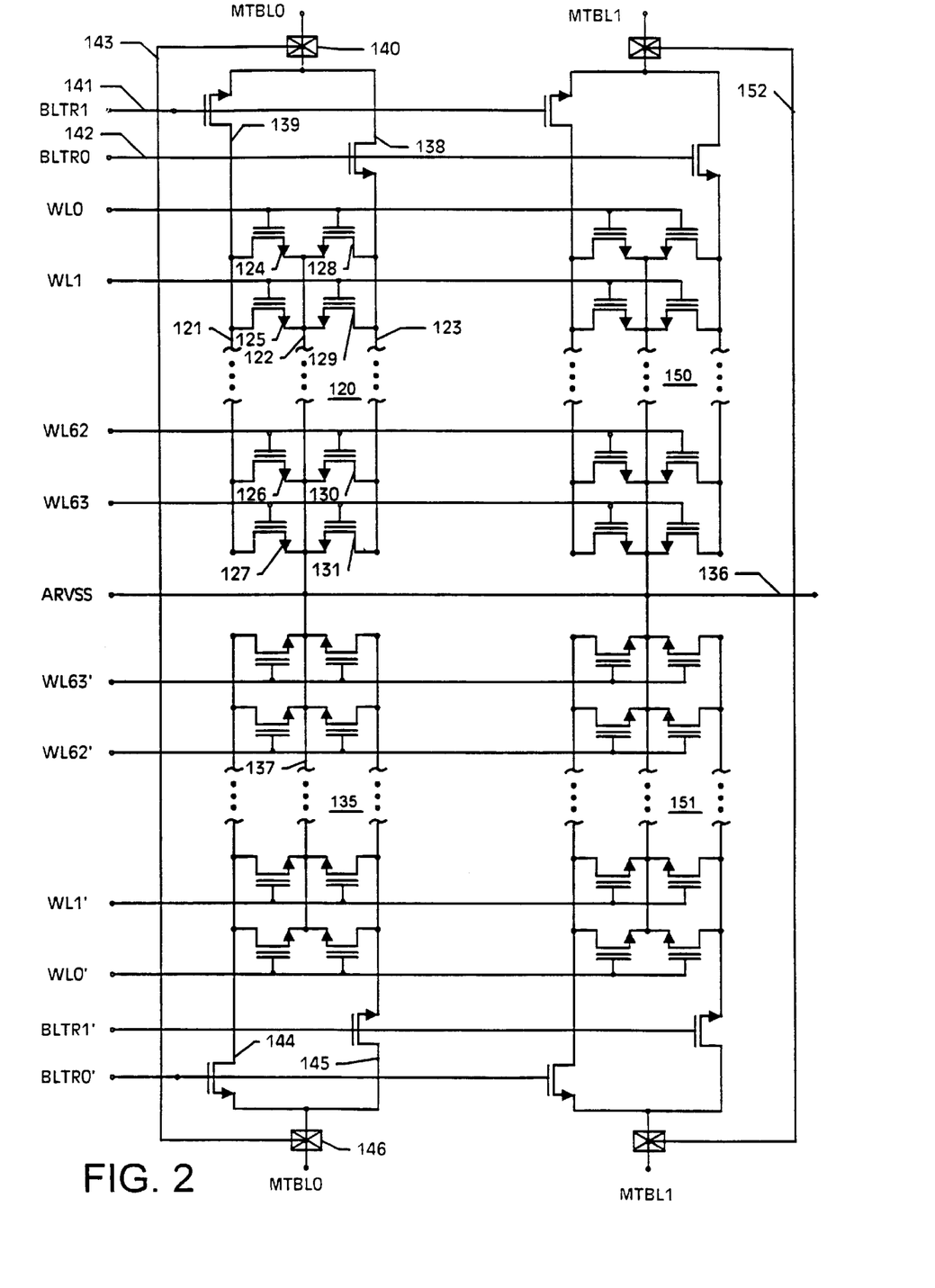
FIG. 2 is a diagram of a floating gate memory array architecture, suitable for use with the present invention.

FIG. 2 illustrates a preferred architecture of the flash EEPROM array according to the present invention, in which two columns of flash EEPROM cells share a single metal bit line. FIG. 2 shows four pairs of columns of the array, where each pair of columns includes flash EEPROM cells in a drain-source-drain configuration.

Thus, the first pair 120 of columns includes a first drain diffusion line 121, a source diffusion line 122, and a second drain diffusion line 123. Word lines WL0 through WL63 each overlay the floating gates of a cell in a first one of the pairs of columns and a cell in the second one of the pairs of columns. The first pair 120 of columns includes one column including cell 124, cell 125, cell 126, and cell 127. Not shown are cells coupled to word lines WL2 through WL61. The second column of the first pair 120 of columns includes cell 128, cell 129, cell 130, and cell 131. Along the same column of the array, a second pair 135 of columns is shown. It has a similar architecture to the pair 120 of columns except that it is laid out in a mirror image. Also, the second pair 135 of columns is connected to the same metal bit line MTBL0 as the first pair 120.

Thus, a cell in the first one of the pair of columns, such as the cell 125, includes a drain in drain diffusion line 121, and a source in the source diffusion line 122. A floating gate overlays the channel region between the first drain diffusion line 121 and the source diffusion line 122. The word line WL1 overlays the floating gate of the cell 125 to establish a flash EEPROM cell.

The column pair 120 and column pair 135 share an array virtual ground diffusion 136 (ARVSS). Thus, the source diffusion line 122 of column pair 120 is coupled to the ground diffusion 136. Similarly, the source diffusion line 137 of column pair 135 is coupled to the ground diffusion 136.

As mentioned above, each pair 120 of columns of cells shares a single metal line. Thus, a block right select transistor 138 and a block left select transistor 139 are included. The transistor 139 includes a drain in the drain diffusion line 121, a source coupled to a metal contact 140, and a gate coupled to the control signal BLTR1 on line 141. Similarly, the right select transistor 138 includes a source in the drain diffusion line 123, a drain coupled to the metal contact 140, and a gate coupled to the control signal BLTR0 on line 142. Thus, the select circuitry, including transistors 138 and 139, provides for selective connection of the first drain diffusion line 121 and a second drain diffusion line 123 to the metal line 143 (MTBL0) through metal contact 140. As can be seen, column pair 135 includes left select transistor 144 and right select transistor 145 which are similarly connected to a metal contact 146. Contact 146 is coupled to the same metal line 143 as is contact 140 which is coupled to column pair 120. The metal line can be shared by more than two columns of cells with additional select circuitry.

The architecture shown in FIG. 2 is based upon a drain-source-drain unit forming two columns of cells which are isolated from adjacent drain-source-drain units to prevent leakage current from adjacent columns of cells. The architecture can be extended to units of more than two columns, with appropriate tolerances for leakage current in the sensing circuitry, or other controls on current leakage from unselected cells. Thus, for instance, fourth and fifth diffusion lines could be added within a given isolated region to create a drain-source-drain-source-drain structure which provides four columns of cells.

Column pairs are laid out horizontally and vertically to provide an array of flash EEPROM cells comprising M word lines and 2N columns. The array requires only N metal bit lines each of which is coupled to a pair of columns of flash EEPROM cells through select circuitry, as described above.

Although the figure only shows four column pairs 120, 135, 150, and 151, coupled to two metal bit lines 143 and 152 (MTBL0–MTBL1), the array is repeated horizontally and vertically as required to establish a large scale flash EEPROM memory array. Thus, column pairs 120 and 150 which share a word line are repeated horizontally to provide a segment of the array. Segments are repeated vertically. A group of segments (e.g., eight segments) having respective word lines coupled to a shared word line driver may be considered a sector of the array.

In a preferred system, 1024 metal bit lines are shared by 2048 columns of cells. The 1024 metal bit lines are connected to respective bit latches in the page buffer. The bit latches store a control bit for each metal bit line, used for verify program, verify, read and erase verify operations as discussed in more detail below.

FIG. 3 illustrates the basic structure of a bit line control element, including bit latch 206 in the page buffer 11 for an integrated circuit memory such as that described in FIG. 1. Thus, FIG. 3 includes a bit line 200 which corresponds for example to a metal bit line MTBL0 in the architecture of FIG. 2. The bit line 200 is connected to a pass transistor 201 which is used for the purpose of isolating a bit line segment 202 within the page buffer from the metal bit line 200 of the array. Pass transistor 201 is controlled by a control signal BLISOB on line 203. The bit line segment 202 within the page buffer is coupled to column select circuits represented by pass gate 204. The column select pass gate 204 is controlled by a column select signal Y(N) on line 205, where N goes from 0 to 63 in a set of 1K bit lines using a 16 bit input/output bus. The page buffer consists of a sequence of bit line control elements, associated with respective bit lines. Each bit line control element includes a bit latch 206 coupled with the bit line 200. The bit latch 206 in a preferred system is implemented with an SRAM type memory element composed of opposing inverters as known in the art. The bit latch 206 has an enable input supplied on line 207 which receives the signal BLATEN. The power used by the bit latch 206 is supplied on line 208. As illustrated in the figure, a signal LATCH POWER is supplied on line 208 which sets the power level of the bit latch 206. Typically this power level will correspond to the VDD voltage in the device. However it is controlled during various operations as discussed below.

The bit latch 206 has two data inputs. The first data input is received on line 210, and the second data input is received on line 212. The first data input on line 210 is coupled to a pass gate structure including a first pass transistor 213 and a second pass transistor 214 connected in series. On the opposite end of pass transistor 214, a constant voltage source 215 is connected. The gate of pass transistor 214 is coupled to the bit line segment 202. The gate of the pass transistor 213 is coupled to a verify control signal VFY (A,B) on line 216. In one embodiment, there are two (or more) verify control signals (A and B) for strobing separate sets of bit latches. In this embodiment, every other bit line receives VFY(A) and the remaining bit lines receive VFY(B).

The second input on line 212 to the bit latch 206 is supplied through pass transistor 220 from the bit line segment 202 which is separated from the main bit line 200 by the pass transistor 201. The gate of pass transistor 220 is connected to line 221 which receives the control signal LATCHB.

Bit latch 206 has output 222. The output 222 is connected as a control input to a pass gate composed of pass transistor 223 and pass transistor 224 connected in series between a multi-level voltage source 225, and the bit line segment 202. The output on line 222 of the bit latch 206 is connected to the gate of pass transistor 223. The gate of pass transistor 224 is connected on line 226 to a data line control signal DLCTL (A,B). In one embodiment, there are two (or more) data line control signals (A and B) separately sensing sets of bit latches in a read mode in coordination with the two VFY (A,B) signals.

The bit latch 206, is configured so that it has a very low impact on the bit line 200, in the terms of current consumption, and so that the current requirements of the bit latch do not fight against the current requirements of the bit line 200 during page mode operations. With a low current bit latch according to the present invention, a wide variety of efficient page mode processes are implemented.

Thus, the first input 210 provides a circuit by which the bit latch 206 is loaded with a constant value in response to a change in the voltage level on the bit line 202 to a determinate level low enough to turn on the pass transistor 214. Thus for example if the constant voltage source is VDD, the pass transistor 214 is implemented as a p-channel device. If the voltage level on the bit line 202 is low, when the control signal VFY on line 216 is strobed, then the constant will be loaded from the constant voltage source 215 into the bit latch 206, without consuming current on the bit line 202.

If the constant voltage source 215 is ground, then the pass transistor 214 is implemented with an n-channel device, along with other modifications, and reacts to a high voltage level on the bit line 202 to cause the constant to be loaded into the bit latch 206.

The input 212 to the bit latch 206 is connected to a second circuit which is controlled by the control signal LATCHB on line 221 to load a data value supplied on the bit line segment 202. This path is utilized primarily for loading data through the column select transistor 204 into the bit latch 206, which can be driven by relatively high current data source. This input however is disabled during sensing of the voltage level on the bit line 200.

The output on line 222 of the bit latch is connected to a third circuit which is utilized to transfer a selected voltage level from the multi-level voltage source 225 onto the bit line segment 202 in response to the control bit stored in the bit latch 206 and the enable signal DLCTL on line 226.

When the pass gate 201 is enabled, the voltage level supplied by the multi-level voltage source 225 is passed onto the main bit line 200. The enable signal DLCTL on line 226 is used for the purpose of controlling the duration of the connection of the multi-level voltage source 225 to the bit line. The multi-level voltage source can be set to a high programming potential, and the application of the programming potential to the bit line is controlled by the contents of the bit latch 206. Also, the multi-level voltage source 225 can be set to VDD, to ground, or to another read potential, and the application of the VDD voltage level to the bit line segment 202 controlled by the contents of the bit latch.

According to another aspect of the invention, the bit latch 206 has a second output on line 230, which is connected to logic 231 to determine whether all the bit latches 206 in the page buffer store the constant value (for program verify) or to determine whether any bit latch 206 in the page buffer stores the constant value (for erase verify). The logic 231 includes one input coupled to each bit latch 206 in the page buffer, as represented by the lines 232. If all of the bit latches 206 store a low constant (at mode 230), then the output of the logic function will be high on line 233 indicating that all bit latches have been reset to the low constant value. If any one of the bit latches has not been reset to the constant value, then the output of the logic function on line 233 will be low, indicating that not all have been reset to the constant value. This logic is useful in program or erase verify situations as described below.

FIG. 4 provides a detailed circuit diagram of a bit line control element including the bit latch 310, such as illustrated in FIG. 3. Bit line 300 is connected to the source of a triple well NMOS transistor 302. The transistor 302 is formed by creating a n-type well in the substrate, then creating a p-type well within the n-type well and forming an NMOS transistor therein. The size of the triple well NMOS transistor 302 in this example is about 40 microns wide by about 1.2 microns long. The p-well in the structure is biased by a bias-potential PWI on line 303. The gate of the transistor 302 is controlled by the control signal BLISOB on line 301. A bit line segment 304 is connected to the source of the transistor 302. Bit line segment 304 is coupled to the drain of a y-select transistor 305. The y-select transistor 305 in the embodiment illustrated is a basic NMOS device having a width of about 30 microns and a length of about 1.2 microns. Source of the transistor 305 is coupled to the data input/output bus at terminal 306. The gate of transistor 305 is controlled by a y-decode signal Y on line 307.

The bit line control element shown in FIG. 4 includes a bit latch storage element 310, which is a basic SRAM type storage element with an enable circuit. Thus, the storage element 310 includes a first inverter composed of p-channel transistor 311 in series with n-channel transistor 312. The p-channel transistor 311 has a width of about 3 microns and a length of about 1.6 microns in this example. The n-channel transistor 312 has a width of about 3 microns and a length of about 1.2 microns in this example. The enable circuit is coupled to the first inverter by means of n-channel transistor 313, which has its source coupled to the ground terminal. The gates of transistors 311 and 312 are connected to node 314 of the memory element. The drain of transistor 311 and the drain of transistor 312 are coupled to node 325. Also the gate of transistor 313 is connected to the control signal BLATEN on line 315.

The second inverter in the memory element 310 is composed of p-channel transistor 318 and n-channel transistor 319. The p-channel transistor 318 has a width of about 6 microns and length of about 1.2 microns, and the n-channel transistor 319 has a width of about 3 microns and a length of about 1.2 microns in this example. The drain of transistor 318 and the drain of transistor 319 are coupled to node 326. The gates of transistors 318 and 319 are coupled to node 325.

The enable circuit in the memory element 310 also includes a p-channel transistor 320 which in this example has a width of about 3 microns and a length of about 0.8 microns. The source of the p-channel transistor 320 is coupled to the node 321 which supplies the LATCHPWR signal, which corresponds to the Latch Power signal in FIG. 3, which is normally VDD. The latch power level is controlled during operations involving the bit line control element as described below.

The storage element 310 has an output at node 326, which is fed back to node 314 as input to the inverter composed of transistors 311 and 312, and an output at node 325 which is connected to the input of the inverter formed of transistors 318 and 319. The outputs 325, 326 can be considered true and complement versions of the data bit stored in the memory element. In the example illustrated node 326 labeled LADATA is considered the true output. The complement output is generated at node 325.

A first input to the memory element 310 is supplied at node 325 across line 350. Line 350 is connected through a pass gate composed of a native n-channel transistor 351 and native p-channel transistor 352 to a supply of the constant voltage, such as VDD 353. The native p-channel transistor is formed using normal PMOS process without a channel enhancement doping so that the threshold of the device is about minus 1.25 volts. In this example, the width of the device is about 5 microns and the length is about 1 micron. The native n-channel device 351 is formed without channel enhancement doping, and thus has a threshold of about 0.45 volts, which is lower than normal n-channel transistors that have enhancement doping in the channel.

The gate of transistor 352 is connected to bit line segment 304. The gate of transistor 351 is connected to the control signal VFY on line 354.

A second input of the memory element 310 is supplied from bit line segment 304 through the pass transistor 356 which is implemented with an n-channel native device having a width of about 12 microns and a length of about 1.2 microns. The gate of the transistor 356 is connected to the control signal LATCHB on line 357.

A first output of the memory element 310 is supplied from node 326 to the gate of a native n-channel transistor 360. The source of the n-channel transistor 360 is connected to the data line power signal DLPWR generated by a multi-level voltage source at node 361. The drain of transistor 360 is coupled to the source of native n-channel pass transistor 362. The drain of transistor 362 is coupled to the bit line segment 304. The gate of transistor 362 is controlled by the data line control signal DLCTL on line 363. Transistor 360 and transistor 362 are implemented with native NMOS devices having widths of about 4 microns and lengths of about 1.2 microns.

A second output of the memory element 310 is supplied at node 326 as well (through node 314) at the gate of n-channel device 370. The source of n-channel device 370 is coupled to ground while the drain of n-channel device 370 is connected to the ABLRES1 line 371. Transistor 370 is implemented with an NMOS device having a width of about 3 microns and a length of about 0.8 microns. The ABLRES1 signal on line 371 is connected in common with other bit latches in the page buffer to a weak pull-up circuit 372, such that if any one of the signals ABLRES1 on line 371 is pulling down (input high), then ABLRES1 is low, providing a NOR gate function to determine whether all of the bit latches in the page buffer have been reset.

The unique low current bit latch structure, such as described in FIGS. 3 and 4, provides the ability to execute efficient page mode program and program verify operations as illustrated in FIG. 5, efficient page read operations as illustrated in FIG. 6, and efficient erase verify operations as illustrated in FIG. 7.

The program and program verify process is described first, referring to FIG. 5. In a preferred system, the program and program verify process begins by loading a page of data into the bit latches in the page buffer (block 501). A page of data in the preferred embodiment is at least 500 bits, and preferably 1K (1024 bits) or more of data. During this process, the bit latches are enabled by the BLATEN signal, the latch power is set to the full supply potential VDD, the LATCHB input is set high, and the Y signal is pulsed per column decode operations, as data is transferred byte-by-byte into the bit latches.

The next step in the process determines whether all of the memory elements in the page buffer have been reset (block 502). This is determined by testing the ABLRES1 signal on line 371. If it is high, then all the bit latches are reset. Else, at least one of the bit latches has not been reset. Thus, if all are reset, then the process is completed with a successful program and verify (or no program is needed) as indicated in block 503. If it is determined at block 502 that at least one of the bit latches remains set, then the algorithm determines whether the program retry limit has been reached (block 504). If the retry limit has been reached, then the process has ended, and an error is indicated. If the retry limit has not been reached, then the algorithm continues to block 505 to apply (or reapply) the programming potential, only to bit lines for which the memory element in the bit latch has not been reset.

In block 505, the program voltages are applied to program the data from the bit latches into the array. In this step, DLPWR on line 361 is set to the program high voltage, the latch power is set to a high voltage, and the control signal BLISOB on line 301 is set to high voltage. This allows the transfer of a high voltage to the bit line 300 if the output of the memory element 310 at node 326 is high by pulsing the DLCTL signal. If the output of the memory element 310 is low, then the high programming voltage is not connected to the bit line.

After the program cycle, the bit lines are pre-charged (block 506). Bit lines are pre-charged using the bit latch structure of the present invention, setting latch power to VDD, the DLCTL control signal on line 363 to VDD, the data line power on line 361 to VDD, the BLISOB signal line 301 to VDD, and by turning off the Y select transistor 305. Thus, the bit line 300 is pre-charged to the VDD level, or about VDD-VT, where VT is NMOS threshold voltage.

After the bit lines are pre-charged, the bit lines are isolated and verify potentials are applied to the array (block 507). The wordlines are set to a verify potential. During this step the latch power is decreased to about 2 volts to reduce the amount of power consumed during the verify operation. The DLCTL signal line 363 is set low to isolate the data line power from the bit line, the BLISOB signal line 301 is set high, and the Y select transistor is turned off. After applying the verify potentials, the verify inputs are strobed (block 508). This occurs by strobing the VFY control signal on line 354. In this operation, the Y select transistor remains turned off. If when the VFY signal is strobed, the voltage on the bit line at node 301 is low enough to turn on transistor 352, then the VDD potential is applied to node 325 of the memory element 310. This results in resetting the memory element so that the output on line 326 is low. If the accessed cell on the bit line has a low threshold, then the pre-charged bit line is discharged through the cell, and the voltage level on the bit line falls below the turn on threshold of the transistor 352. In this way, the memory element 310 does not fight for current on the bit line, and relatively high speed verify operation is achieved.

After strobing the verify inputs on the bit latches in block 508, the process loops to block 502 to retry programming of cells which fail verify, for a threshold number of retries.

The unique bit latch structure of the present invention also allows for an efficient page read operation as illustrated in FIG. 6. In this operation, the algorithm begins by setting all of the bit latches to a constant value, such that the output on line 326 is high (block 600). One technique for setting all of the bit latches high in parallel can be achieved by turning on all of the Y select transistors 307 for all bit lines. The latch power level on line 321 is decreased to about 1 volt. The data is supplied on node 306 at VDD, and the LATCHB signal line 357 is set to VDD. This way, the data value is transferred to the input 314 of the latch. At that point, the latch power is slowly powered up to latch the data into the cell with the relatively low current parallel operation. Alternatively, the bit latches can be set byte-by-byte, relying on the column decoding operation in a manner similar to loading into the bit latches.

After all bit latches have been pre-set, the algorithm proceeds to a verify procedure which is based on first a pre-charge of the bit line (block 601). This pre-charge is accomplished using the same control signals as is described for block 506 of FIG. 5. After pre-charging the bit lines, read potentials are applied to the wordlines (block 602). Again, control signals for this process are similar to those as applied during block 507 of FIG. 5. After applying read potentials, the verify inputs on the bit latches are strobed (block 603). This is similar to the operation of block 508 of FIG. 5. After strobing the verify inputs, the control bits stored in the bit latches are ready for reading through data input/output bus of integrated circuit (block 604). This process is executed by setting the DLPWR value to ground, setting the DLCTL value to VDD, setting the BLISOB signal to ground and the LATCHB signal to ground. The Y transistors are pulsed in response to the column decoding operation. Thus, if a bit latch has been reset, then the output LADATA on line 326 will be low, preventing the connection of ground to the bit line segment 304. However, if it has not been reset, then the high value stored in the memory element will couple ground to the bit line segment 304 which will be transferred to the sense amplifiers. High speed page access is achieved due to low capacitance loading between the bit latch and the sense amplifiers (bit lines isolated), and high current available from the bit latch. Optionally, data can be loaded into the SRAM cache for a more flexible interface.

Thus, a page mode read is provided, in which the first byte is available after the process of FIG. 6 is executed, which takes on the order of a microsecond, depending on the bit line settling times and the like. However, all subsequent bytes in the page can be read at the SRAM-like speed, which is much faster than normal reads to floating gate memory arrays. For example, typical read time for a floating gate memory array is about 100 nanoseconds, while the typical read time from a bit latch is on the order of 50 nanoseconds or less. With a 128 byte page buffer, read in parallel, the first byte will be available in about 1 microsecond (the equivalent of reading 10 bytes from the array directly), and all of the following 127 bytes are available for reading with 50 nanosecond access times, either sequentially, or randomly from the bit latch. Overall throughput is increased using the page read process as illustrated in FIG. 6.

FIG. 7 provides an example erase verify operation using the low current bit latch of the present invention. The process begins after an erase operation, which in the embodiment described is based on charging the floating gates of a block of memory cells in the array, to establish a high threshold voltage state for all of the erased cells. After the erase, the bit latches are set to the constant value of 1 (block 700), using a technique such as that described with reference to block 600 of FIG. 6. Next, the bit lines are pre-charged (block 701). Again, this is similar to the process described with reference to block 506 of FIG. 5. After pre-charging the bit lines, erase verify potentials are applied to the wordlines (block 702). This is similar to the process described with reference to block 507 of FIG. 5, except that erase verify potentials are applied to the wordlines. These potentials are near VDD, such as for example 4.5 volts, to establish an erase verify margin. After applying erase verify potentials, the verify inputs on the bit latches are strobed (block 703), such as described with reference to block 508 of FIG. 5. After strobing the bit latches, the algorithm proceeds to determine whether any low threshold cells were detected (block 704). A low threshold cell would result in resetting of the bit latch. Thus, it is necessary to determine whether any one bit latch has been reset, the opposite operation to determining whether all bit latches have been reset as described with reference to block 502 of FIG. 5. This can be accomplished by a read process in which the bit latches are read byte-by-byte in through the column decoder. Alternatively, logic can be used to sense the output of the bit latches in parallel for example, using a NOR function to determine whether one cell has been reset.

If there were no low threshold cells detected, then the process is finished as indicated in block 705. If a low threshold cell was detected, then the algorithm determines whether a retry limit had been reached (block 706). If the retry limit is reached, then the process is finished at block 705, and an error is indicated. If the retry limit had not been reached, then a re-erase operation is executed (block 707).

The bit latch structure of FIG. 4 may be modified to use an n-channel transistor in place of the p-channel transistor 352. In the n-channel scheme, transistors 352, 351, and 370 are connected to node 326, and the source of transistor 352 is grounded. The gate of the transistor 352 (n-channel in this embodiment) is connected to the bit line segment 304. The n-channel approach is particularly well suited for the erase verify sequence. For example, an erase verify sequence would include the following steps:
1) Preset all of the bit latches so that node 326 stores a high level.
2) Precharge all of the bit lines to a high level.
3) Apply a voltage level to the wordline for erase verify.
4) For those erased high threshold cells, the bit line will remain high, when the verify potential is strobed. This causes node 326 to be reset to zero. If a low threshold cell exists, then the bit line is discharged to ground through the cell, and the bit latch node 326 associated with the low threshold cell remains at the preset high value. Node 371 is then pulled down to trigger another retry pulse.

Accordingly, the present invention provides a unique bit line control element structure which supports a parallel program and program verify algorithm, a page mode read, and a page mode erase verify. Three critical issues solved by the unique bit latch structure, include excess current and power crash problems associated with a highly parallel operation on a latch structure, bit line coupling noise which might occur between bit lines during the parallel operation, and the bit line discharge time associated with the verify operations. The excess current and power crash problem is solved by providing the capability control the power level on the memory element in the bit latches. Thus, at appropriate times the bit latch power is reduced to reduce the current consumption of the device. The bit line coupling problem caused by capacitive coupling between adjacent bit lines, can be solved by even and odd bit line logic, so that two sets of control signals are used for strobing the VFY signal and the DLCTL signal in the structure of FIG. 4. By alternate strobing, neighboring bit lines are not sensed at the same time, so that fringing capacitance between them will not cause unwanted disturbance.

The bit line discharge time depends on the bit line capacitance and the cell discharge current. However, because the bit line is isolated from the bit latch during the verify process, discharge time is not complicated by fighting for current consumption against the bit latch structure. Thus a calculated fixed time can be used by the state machine executing the verify process. Alternatively, a small current source, such as a reference floating gate cell, can be used to discharge a reference bit line capacitor and to generate a timeout signal in response to detecting the level on the reference bit line capacitor. This reference bit line capacitor approach provides more chip specific verify timing than possible using a calculated fixed time.

Also, the same bit latch is used for a page mode read operation. Conventional flash memory read operations are random access and relatively slow. However, a high speed page mode read access can be executed as discussed above using the unique bit latch of the present invention.

Finally, a page mode erase verify process is described which can be used to speed up the erase operation in a flash memory device.

The present invention has been described primarily with reference to a memory cell in which the flash erased state is defined as a high threshold for the floating gate memory cells, and a programmed state is defined as a low threshold. However, the present invention can be applied if the flash cell is defined as erased when it has a low threshold, and programmed when it has a high threshold.

The foregoing description of preferred embodiments of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. For an array of floating gate memory cells including bit lines coupled with corresponding columns of cells in the array, word lines coupled with corresponding rows of cells in the array, and bit latches coupled to the respective bit lines, a method for determining a state of a set of memory cells in the array, comprising the steps of:

setting a set of bit lines across which memory cells in the set of memory cells are accessible to a pre-charge voltage level;

applying a word line voltage to a word line across which memory cells in the set of memory cells are accessible; and responding to changes in respective voltage levels of bit lines in the set of bit lines in parallel to store a constant in bit latches in the set of bit latches coupled to bit lines on which the respective voltage levels pass a determinate threshold during the step of applying a word line voltage;

wherein the step of responding to changes includes providing pass transistors, having gate terminals, between a supply of the constant and inputs of respective bit latches in the set of bit latches, and connecting the bit lines in the set of bit lines to gate terminals of the pass transistors.

2. The method of claim 1, wherein the pre-charge voltage level is higher than the determinate threshold.

3. The method of claim 1, wherein the pre-charge voltage level is lower than the determinate threshold.

4. For an array of floating gate memory cells including bit lines coupled with corresponding columns of cells in the array, word lines coupled with corresponding rows of cells in the array, and bit latches coupled to the respective bit lines, a method for determining a state of a set of memory cells in the array, comprising the steps of:

setting a set of bit lines across which memory cells in the set of memory cells are accessible to a pre-charge voltage level;

applying a word line voltage to a word line across which memory cells in the set of memory cells are accessible; and responding to changes in respective voltage levels of bit lines in the set of bit lines in parallel to store a constant in bit latches in the set of bit latches coupled to bit lines on which the respective voltage levels pass a determinate threshold during the step of applying a word line voltage;

wherein the step of responding to changes includes providing p-channel pass transistors, having gate terminals, between a voltage source and inputs of respective bit latches in the set of bit latches, and connecting the bit lines in the set of bit lines to gate terminals of the p-channel pass transistors, and the pre-charge voltage level is high enough to turn off the p-channel pass transistors, and the determinate threshold is adequate to turn on the p-channel pass transistors.

5. For an array of floating gate memory cells including bit lines coupled with corresponding columns of cells in the array, word lines coupled with corresponding rows of cells in the array, and bit latches coupled to the respective bit lines, a method for determining a state of a set of memory cells in the array, comprising the steps of:

setting a set of bit lines across which memory cells in the set of memory cells are accessible to a pre-charge voltage level;

applying a word line voltage to a word line across which memory cells in the set of memory cells are accessible; and responding to changes in respective voltage levels of bit lines in the set of bit lines in parallel to store a constant in bit latches in the set of bit latches coupled to bit lines on which the respective voltage levels pass a determinate threshold during the step of applying a word line voltage;

wherein the step of responding to changes includes providing n-channel pass transistors, having gate terminals, between a voltage source and inputs of respective bit latches in the set of bit latches, and connecting the bit lines in the set of bit lines to gate terminals of the n-channel pass transistors, and the pre-charge voltage level is high enough to turn on the n-channel pass transistors, and the determinate threshold is adequate to the turn on the n-channel pass transistors.

6. For an array of floating gate memory cells including bit lines coupled with corresponding columns of cells in the array, word lines coupled with corresponding rows of cells in the array, and bit latches coupled to the respective bit lines, a method for determining a state of a set of memory cells in the array, comprising the steps of:

setting a set of bit lines across which memory cells in the set of memory cells are accessible to a pre-charge voltage level;

applying a word line voltage to a word line across which memory cells in the set of memory cells are accessible; and responding to changes in respective voltage levels of bit lines in the set of bit lines in parallel to store a constant in bit latches in the set of bit latches coupled to bit lines on which the respective voltage levels pass a determinate threshold during the step of applying a word line voltage;

wherein the step of responding includes storing the constant in bit latches substantially without drawing current from the respective bit lines.

7. The method of claim 1, including prior to said step of setting the set of bit lines to a pre-charge voltage level, the step of:

presetting the set of bit latches to the complement of said constant.

8. The method of claim 7, including after said step of responding, the step of:

providing read access to said set of bit latches for reading the bytes of data.

9. The method of claim 8, wherein said set of bit latches includes more than 500 members.

10. The method of claim 8, wherein said set of bit latches includes more than 1000 members.

11. The method of claim 7, including after said step of responding, the step of:

determining whether all bit latches in the set of bit latches store the constant.

12. The method of claim 1, including prior to said step of setting the set of bit lines to the pre-charge voltage level, the step of:

storing data in the set of bit latches to be programmed into the set of memory cells in the array; and applying a programming potential to bit lines in the set of bit lines in response to data in corresponding bit latches in the set of bit latches.

13. The method of claim 12, including after said step of responding, the step of:

determining whether all bit latches in the set of bit latches have been set to the constant, to verify programming of the set of memory cells.

14. The method of claim 12, wherein said programming potential is greater than 5 volts.

15. The method of claim 1, including prior to said step of setting the set of bit lines to the pre-charge voltage level, the step of:

presetting the set of bit latches to the complement of said constant; and including after said step of responding, the step of:

determining whether any bit latch in the set of bit latches has been reset to the constant, to verify an erase operation.

16. The method of claim 1, wherein there are a plurality of sets of bit latches, and the step of responding includes first responding to changes in a first set in the plurality of sets, and then responding to changes in a second set in the plurality of sets.

17. The method of claim 16, wherein bit latches in the first set are coupled to every other bit line in a plurality of bit lines in the array, and bit latches in the second set are coupled to remaining bit lines in said plurality of bit lines in the array.

18. The method of claim 12, wherein there are a plurality of sets of bit latches, and the step of applying a program potential includes first applying the programming potential to bit lines corresponding to bit latches in a first set in the plurality of sets, and then applying the programming potential to bit lines corresponding to bit latches in a second set in the plurality of sets.

19. The method of claim 18, wherein bit latches in the first set are coupled to every other bit line in a plurality of bit lines in the array, and bit latches in the second set are coupled to remaining bit lines in said plurality of bit lines in the array.

20. The method of claim 1, wherein a power supply voltage is applied to the bit latches, and during said step of responding the power supply voltage is reduced.

21. For an array of floating gate memory cells including bit lines coupled with corresponding columns of cells in the array, word lines coupled with corresponding rows of cells in the array, and bit latches coupled to the respective bit lines, a method for programming a set of memory cells in the array, comprising the steps of:

storing data in the set of bit latches to be programmed into a set of memory cells in the array;

applying a programming potential to bit lines in the set of bit lines in response to data in corresponding bit latches in the set of bit latches;

setting a set of bit lines across which memory cells in the set of memory cells are accessible to a pre-charge voltage level;

applying a word line voltage to a word line across which memory cells in the set of memory cells are accessible;

responding to changes in respective voltage levels of bit lines in the set of bit lines in parallel to store a constant in bit latches in the set of bit latches coupled to bit lines on which the respective voltage levels pass a determinate threshold during the step of applying a word line voltage; and determining whether all bit latches in the set of bit latches have been set to the constant, to verify programming of the set of memory cells.

22. For an array of floating gate memory cells including bit lines coupled with corresponding columns of cells in the array, word lines coupled with corresponding rows of cells in the array, and bit latches coupled to the respective bit lines, a method for reading a set of memory cells in the array, comprising the steps of:

setting bit latches the set of bit latches coupled to a set of bit lines in the array to a constant value;

setting the set of bit lines across which memory cells in the set of memory cells are accessible to a pre-charge voltage level;

applying a word line voltage to a word line across which memory cells in the set of memory cells are accessible;

responding to changes in respective voltage levels of bit lines in the set of bit lines in parallel to store a complement of the constant in bit latches in the set of bit latches coupled to bit lines on which the respective voltage levels pass a determinate threshold during the step of applying a word line voltage; and isolating the bit lines from the bit latches in the set of bit latches and transferring the data stored in the set of bit latches to a data input/output structure.

23. For an array of floating gate memory cells including bit lines coupled with corresponding columns of cells in the array, word lines coupled with corresponding rows of cells in the array, and bit latches coupled to the respective bit lines, a method for erasing a set of memory cells in the array, comprising the steps of:

applying erase potentials to the set of memory cells;

presetting the set of bit latches to a constant;

setting a set of bit lines across which memory cells in the set of memory cells are accessible to a pre-charge voltage level;

applying a word line voltage to a word line across which memory cells in the set of memory cells are accessible;

responding to changes in respective voltage levels of bit lines in the set of bit lines in parallel to store a complement of the constant in bit latches in the set of bit latches coupled to bit lines on which the respective voltage levels pass a determinate threshold during the step of applying a word line voltage; and determining whether any bit latch in the set of bit latches has been reset to the constant, to verify the erase of the set of memory cells.

24. An integrated circuit memory, comprising:

an array of floating gate storage cells, including a plurality of bit lines coupled with corresponding columns of cells in the array and a plurality of word lines coupled with corresponding rows of cells in the array;

a data input/output bus;

column decoding circuitry, coupled with the plurality of bit lines and the data input/output bus, which selectively connects an addressed set of bit lines selected from the plurality of bit lines to the data input/output bus;

a plurality of bit line control elements, bit line control elements in the plurality of bit line control elements coupled with corresponding bit lines in the plurality of bit lines, at least one bit line control element in the plurality of bit line control elements including a) a memory element, b) first means, connected to the memory element and the corresponding bit line and having a load control input, for selectively connecting a current path between the corresponding bit line and the memory element in response to a signal on the load control input to load a control bit in the memory element from the corresponding bit line, c) second means, connected to the memory element and a constant supply, and having an enable input and an input connected to the corresponding bit line, for selectively connecting the constant supply to the memory element in response to a determinate voltage level on the corresponding bit line by a current path isolated from the corresponding bit line when enabled by a signal on the enable input, to load a constant in the memory element, and d) third means, connected to the corresponding bit line and a bit line voltage source, and having an enable input and an input connected to the memory element, for selectively connecting the bit line voltage source to the corresponding bit line in response to one state of the control bit stored in the memory element by a current path isolated from the memory element when enabled by a signal on the enable input; and control logic, coupled with the plurality of bit line control elements, which supplies signals to the enable inputs of the first, second and third means to establish a load state, a program state, and a verify state for the plurality of bit line control elements by in the load state enabling the first means, in the program state enabling the third means, and in the verify state enabling the second means.

25. The integrated circuit memory of claim 24, wherein the memory element in said at least one bit line control element comprises:

a true node and a complement node;

a first inverter having an input connected to the true node and an output connected to the complement node; and a second inverter having an input connected to the complement node and an output connected to the true node.

26. The integrated circuit memory of claim 25, wherein the first means in said at least one bit line control element comprises:

a pass gate connected between the corresponding bit line and one of the true and complement nodes of the memory element, and having a control gate connected to the enable input of the first means.

27. The integrated circuit memory of claim 25, wherein the second means in said at least one bit line control element comprises:

a pass gate connected between the constant supply and one of the true and complement nodes of the memory element, and having a control input connected to the corresponding bit line and an enable input connected to a verify control signal.

28. The integrated circuit memory of claim 25, wherein the third means in said at least one bit line control element comprises:

a pass gate connected between the bit line voltage source and the corresponding bit line, and having a control input connected to one of the true and complement nodes of the memory element, and an enable input connected to a data line control signal.

29. The integrated circuit memory of claim 24, wherein the control logic includes a state machine which in the load state, controls the column decoder to load sets of bit line control elements with control bits supplied across the data input/output bus;

in the program state, sets the bit line voltage source to a program potential, and supplies a signal to the enable input of the third means in the at least one bit line control element to transfer the program potential to the corresponding bit line; and in the verify state, pre-charges the plurality of bit lines, applies a verify potential to a selected word line, and supplies a signal to the enable input of the second means in the at least one bit line control element to store the constant in the memory element in the at least one bit line control element if the determinate voltage level is achieved on the corresponding bit line.

30. The integrated circuit memory of claim 24, wherein the control logic includes a state machine which executes a read operation, in which the state machine sets the bit line voltage source to a read potential, supplies a signal to the enable input of the third means in the at least one bit line control element, and controls the column decoder to connect sets of bit lines to the data input/output bus to supply sets of data from the memory elements in the corresponding bit line control element or elements.

31. The integrated circuit memory of claim 24, wherein the control logic includes logic which enables the second means of every other bit line control element on the plurality of bit lines during a first cycle of the verify state, and enables the second means of remaining bit line control elements on the plurality of bit lines during a second cycle of the verify state.

32. The integrated circuit memory of claim 24, wherein the memory element in the at least one bit line control element is coupled to a source of a supply voltage, and the control logic includes logic which reduces the supply voltage during at least part of the verify state.

33. For an array of floating gate memory cells including bit lines coupled with corresponding columns of cells in the array, word lines coupled with corresponding rows of cells in the array, and bit latches coupled to the respective bit lines, a method for determining a state of a set of memory cells in the array, comprising the steps of:

setting a set of bit lines across which memory cells in the set of memory cells are accessible to a pre-charge voltage level;

applying a word line voltage to a word line across which memory cells in the set of memory cells are accessible; and responding to changes in respective voltage levels of bit lines in the set of bit lines in parallel to store a constant in bit latches in the set of bit latches coupled to bit lines on which the respective voltage levels pass a determinate threshold during the step of applying a word line voltage;

including prior to said step of setting the set of bit lines to the pre-charge voltage level, the step of:

presetting the set of bit latches to the complement of said constant; and including after said step of responding, the step of:

determining whether any bit latch in the set of bit latches has been reset to the constant, to verify an erase operation.

* * * * *